(12) United States Patent
Chu et al.

(10) Patent No.: US 6,678,206 B2
(45) Date of Patent: Jan. 13, 2004

(54) SEMICONDUCTOR MEMORY DEVICE INCLUDING STANDBY MODE FOR REDUCING CURRENT CONSUMPTION OF DELAY LOCKED LOOP

(75) Inventors: Yong-Gyu Chu, Kyungki-do (KR); Kyu-Chan Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/106,931

(22) Filed: Mar. 25, 2002

(65) Prior Publication Data

US 2002/0136082 A1 Sep. 26, 2002

(30) Foreign Application Priority Data

Mar. 26, 2001 (KR) ........................................ 2001-15643

(51) Int. Cl.[7] .................................................. G11C 8/00
(52) U.S. Cl. ...................... 365/233; 365/194; 365/229
(58) Field of Search ................................. 365/233, 194, 365/229, 226, 227, 230.08, 189.05

(56) References Cited

U.S. PATENT DOCUMENTS 5,337,285 A    8/1994  Ware et al.
6,141,292 A  * 10/2000  Lee et al. ................... 365/233
6,266,294 B1 * 7/2001  Yada et al. ................. 365/233

FOREIGN PATENT DOCUMENTS

JP    6338793    12/1994
KR    0146083     5/1998

OTHER PUBLICATIONS

English language Abstract of JP6338793.
English language Abstract of Korean Patent Publication No. 0146083, issued May 8, 1998.

* cited by examiner

*Primary Examiner*—David Lam
(74) *Attorney, Agent, or Firm*—Marger Johnson & McCollom, P.C.

(57) ABSTRACT

A semiconductor memory device including a delay locked loop (DLL) that is capable of turning off the DLL in a precharge mode while maintaining locking information stored before the DLL operates in the precharge mode is provided. The DLL includes an ON/OFF mode for turning the DLL on or off. The DLL also includes a standby mode for turning the DLL off while still maintaining locking information stored before the DLL operates in a precharge mode in response to the activation of a standby enabling signal. The standby enabling signal is inactive when the DLL locks. The standby enabling signal is active when DLL lock is complete.

20 Claims, 4 Drawing Sheets

SEMICONDUCTOR MEMORY DEVICE INCLUDING STANDBY MODE FOR REDUCING CURRENT CONSUMPTION OF DELAY LOCKED LOOP

This application claims priority from Korean Patent Application Number 01-015643 filed Mar. 26, 2001, incorporated herein by reference.

BACKGROUND OF THE INVENTION

1. Field of the Invention

The present invention relates to a semiconductor memory device and more particularly, to a semiconductor memory device including a control circuit for a delay locked loop (DLL).

2. Description of the Related Art

A DLL is included in a semiconductor memory device for the purpose of facilitating data transmission between the semiconductor memory device and a memory controller irrespective of the operation speed of the semiconductor memory device.

The DLL delays an external clock and generates an internal clock that is capable of driving a data output buffer. The data output buffer synchronizes output data with the rising edge or falling edge of the external clock responsive to the internal clock and then outputs the output data.

The DLL delays an externally input data strobe signal and synchronizes a phase of the data signal input into the data output buffer with respect to the phase of the data strobe signal. The DLL synchronization of the data signal with the data strobe signal optimizes data input setup/hold.

Figure 1:
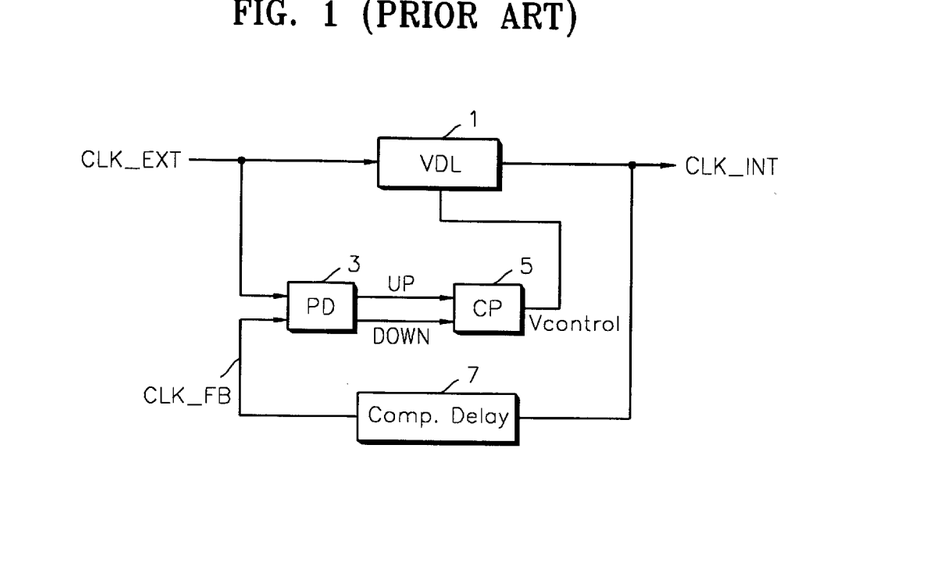
FIG. 1 is a block diagram of a DLL.

FIG. 1 is a block-diagram illustrating an analog DLL. Referring to FIG. 1, the conventional analog DLL includes a variable delay line (VDL) 1, a phase detector 3, a charge pump 5, and a compensation delay circuit 7.

The compensation delay circuit 7 outputs a feedback clock CLK_FB to the phase detector 3 in response to the internal clock CLK_INT externally supplied. The phase of the feedback clock CLK-FB leads the phase of an internal clock CLK_INT.

The phase detector 3 compares the phase of the feedback clock CLK_FB, the phase of which leads the phase of the internal clock CLK_INT with the phase of the external clock CLK_EXT and outputs a signal UP or DOWN responsive to the comparison.

The charge pump 5 outputs a control voltage Vcontrol for controlling the delay time of the VDL 1 responsive to the signal UP or DOWN output from the phase detector 3. The VDL 1 controls the delay time of the external clock CLK_ENT responsive to the control voltage Vcontrol of the charge pump 5.

Where the time when data is output is prior to receiving the external clock CLK_ENT, the VDL 1 increases the delay time. Conversely, where data is output after receiving the external clock CLK_ENT, the VDL 1 decreases the delay time. The DLL thus synchronizes and internal clock CLK_IN with the external clock CLK_ENT.

Accordingly, the DLL can always synchronize when data is output with the external clock CLK_ENT, irrespective of variations of power voltage or temperature.

When the DLL synchronizes the internal clock CLK_INT with the external clock CLK_EXT, the VDL 1, the phase detector 3, the compensation delay circuit 7, and the charge pump 5 all operate consuming a considerable amount of current.

When the DLL is turned off, the existing locking information is lost, and a considerable amount of time is required to lock the DLL. Accordingly, in a semiconductor memory device including the conventional DLL, the DLL is on in most operation modes. The DLL is turned off only in the self-refresh operation of a DRAM. In the latter case, the DLL is re-locked. Thus, even in a precharge mode where the DLL does not operate, a considerable amount of current (e.g., 10–20 mA) is consumed.

A data output strobe (not shown) is controlled by the internal clock CLK_INT that is generated with data output in the DLL. To output a preamble well, the DLL must generate a control signal in just three clock cycles immediately after receiving an active command. However, 200 clock cycles are required for locking the DLL that has previously been turned off. Thus, if the DLL is turned off when a semiconductor memory device operates in a precharge mode, it is impossible to output data in only three cycles immediately after the active command is input.

SUMMARY OF THE INVENTION

It is an object of the present invention to overcome the disadvantages associated with known semiconductor memory devices.

It is another object of the present invention to provide a semiconductor memory device capable of reducing current consumption of a DLL operating in a precharge mode.

Provided is a semiconductor memory device including a DLL adapted to generate an internal clock synchronized with an external clock responsive to a standby signal and a control signal generator adapted to output the standby signal responsive to a plurality of DLL control signals. The plurality of control signals includes a DLL reset, a DLL lock, a refresh mode, an address strobe, and a mode register signal.

The DLL comprises a phase detector adapted to generate a phase signal indicative of a phase difference between a phase of the external clock and a phase of the internal clock responsive to the standby signal, a charge pump adapted to generate a voltage control signal responsive to the standby signal and the phase signal, and a variable delay line (VDL) adapted to output the internal clock synchronized with the external clock responsive to the voltage control signal.

The control signal generator comprises a first logic circuit adapted to output a first signal to a DLL reset and refresh mode signals, a second logic circuit adapted to output a second signal responsive to an address strobe, an mode register, and a DLL lock signals, and a standby enabling circuit adapted to generate a standby enabling signal responsive to the first and second signals.

The first signal is active responsive to an active DLL reset signal and the second signal is active responsive to an active DLL lock signal.

The standby enabling circuit comprises a cross-coupled NOR circuit.

The phase detector is reset when the standby signal is active.

The variable delay line comprises at least one delay device and a delay time of the at least one delay device operates responsive to the voltage control signal.

The charge pump comprises a control voltage generator adapted to generate a current responsive to the phase signal.

Also provided is a DLL comprising an ON/OFF mode and a standby mode wherein the ON/OFF mode turns the DLL on or off and wherein the standby mode turns the DLL off while maintaining lock information responsive to a standby signal. The standby signal is enabled responsive to a standby enable signal and the standby enable signal is inactive when a DLL reset signal is active. The standby enable signal is active when a DLL lock signal is active.

If one of the DLLRESET and SELF_EXIT signals is activated, the standby enable signal STB_EN is deactivated. In this case, the DLL cannot operate in a standby mode even though the semiconductor memory device is in the pre-charge mode. In the standby mode, locking information stored before the precharge mode of the semiconductor memory device is maintained, and predetermined circuits included in the DLL do not operate.

BRIEF DESCRIPTION OF THE DRAWINGS

The above object and advantages of the present invention will become more apparent by describing in detail a preferred embodiment thereof with reference to the attached drawings.

DETAILED DESCRIPTION OF THE INVENTION

The present invention will now be described more fully with reference to the accompanying drawings, in which a preferred embodiment of the invention is shown. Same reference numerals in different drawings represent the same element.

Figure 2:
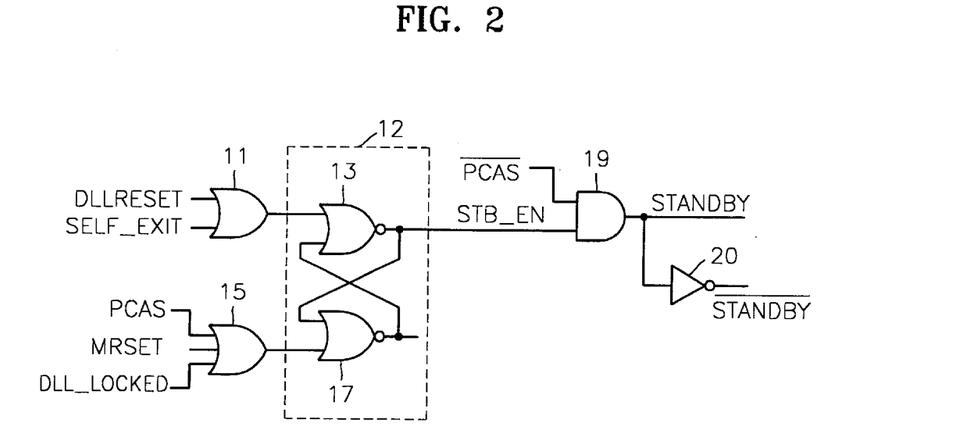
FIG. 2 is a circuit diagram of a control signal generator according to an embodiment of the present invention.
Figure 3:
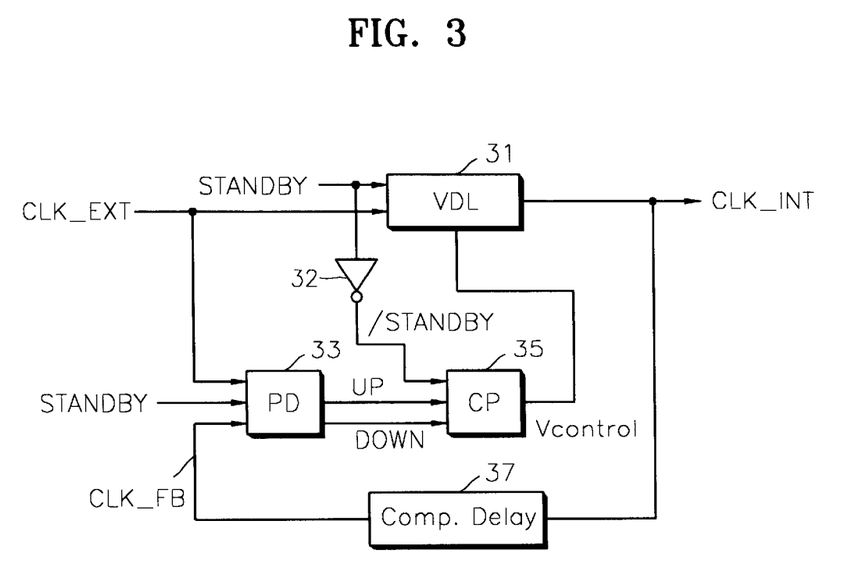
FIG. 3 is a block diagram of a DLL including a control signal generator according to an embodiment of the present invention.

A semiconductor memory device according to an embodiment of the present invention includes a control signal generator as shown in FIG. 2 and the DLL shown in FIG. 3. Referring to FIG. 2, the control signal generator includes a first logic circuit 11, a second logic circuit 15, a standby enabling signal generator 12, and an AND circuit 19. The standby enabling signal generator 12 includes first and second logic gates 13 and 17, respectively.

The first logic circuit 11 performs an OR operation on a DLLRESET signal and a SELF_EXIT signal. The DLL-RESET and the SELF-EXIT signals lock the DLL. The DLLRESET signal is generated in a mode register set (MRS) (not shown) for the purpose of resetting the DLL. DLLRESET signal is activated for a predetermined time. The SELF_EXIT signal is activated responsive to the completion of a self-refresh operation. Therefore, the DLL-RESET and SELF_EXIT signals are predetermined control signals for controlling the operation of the DLL.

The DLL locks after the DLLRESET and SELF_EXIT signals are generated, and thus the DLLRESET and SELF_EXIT signals operate the DLL for a predetermined time irrespective of a DRAM operation mode (an active mode or a precharge mode).

The second logic circuit 15 performs an OR operation on a PCAS signal, an MRSET signal, and a DLL_LOCKED signal. The PCAS signal is generated responsive to an active command. The PCAS signal is generated by a column address strobe signal (CAS), such as read or write.

The MRSET signal sets the operation mode of the DLL. According to the specification of a double date rate synchronous random access memory (DDRSDRAM), the MRSET signal is applied past 200 cycles after the DLL is reset. The DDL_LOCKED signal indicates completion of the DLL locking time. DLL locking time is the time taken to lock after the DLL is turned on by counter (not shown) installed in the semiconductor memory device. In other words, the DLL_LOCKED signal indicates DLL locking time is completed.

A DLL used in a DDR synchronous DRAM might have a locking time of at most 200 clock cycles. The PCAS signal, the MRSET signal, and the DLL_LOCKED signal indicate completion of locking of the DLL is completed after the DLLRESET signal and the SELF_EXIT are applied. The DLL_LOCKED signal is the most effective signal. The PCAS and MRSET signals are provided as needed.

The standby enabling signal generator 12 might be a latch into which the output signal of the first logic circuit 11 is provided as a reset input and the output signal of the second logic circuit 15 is provided as a set input. The standby enabling signal generator 12 of FIG. 2 is comprised of a cross-coupled NOR circuit and generates a standby enabling signal STB_EN responsive to the output signals of the first and second logic circuits 11 and 15, respectively.

The AND circuit 19 performs an AND operation on the standby enabling signal STB_EN and the signal/PCAS to generate a signal standby. The PCAS signal, indicates the operation mode of a semiconductor device, indicating that a semiconductor memory device is in a precharge mode.

In a case where one of the DLLRESET and SELF_EXIT signals is activated, the standby enabling signal STB_EN activating the standby signal STANDBY is inactivated. In a case where one of the PCAS, MRSET, and DLL_LOCKED signals is activated, the standby enabling signal STB_EB is activated.

Accordingly, only if the standby enabling signal STB_EN is activated when the semiconductor memory device is in a precharge mode (that is, in a mode where the command signal/PCAS is activated to a logic 'high') is the standby signal STANDBY activated.

The case where the standby signal STANDBY is activated is referred to as a standby mode. The standby mode is neither an on-state where the DLL continuously updates locking information nor an off-state where the existing locking information is lost and the DLL does not operate. Rather it is a third operation state where locking information stored before the precharge mode of a semiconductor memory device is maintained and predetermined circuits included in the DLL do not operate.

Accordingly, if one of the PCAS, MRSET, and DLL_LOCKED signals is activated, the standby enabling signal STB_EN is activated, enabling or activating the standby signal STANDBY putting the a semiconductor memory device in a precharge mode. Thus, the DLL can operate in a standby mode.

However, if one of the DLLRESET and SELF_EXIT signals is activated, the standby enabling signal STB_EN is deactivated. In this case the DLL cannot operate in a standby mode even though the semiconductor memory device is in the precharge mode.

Figure 7:
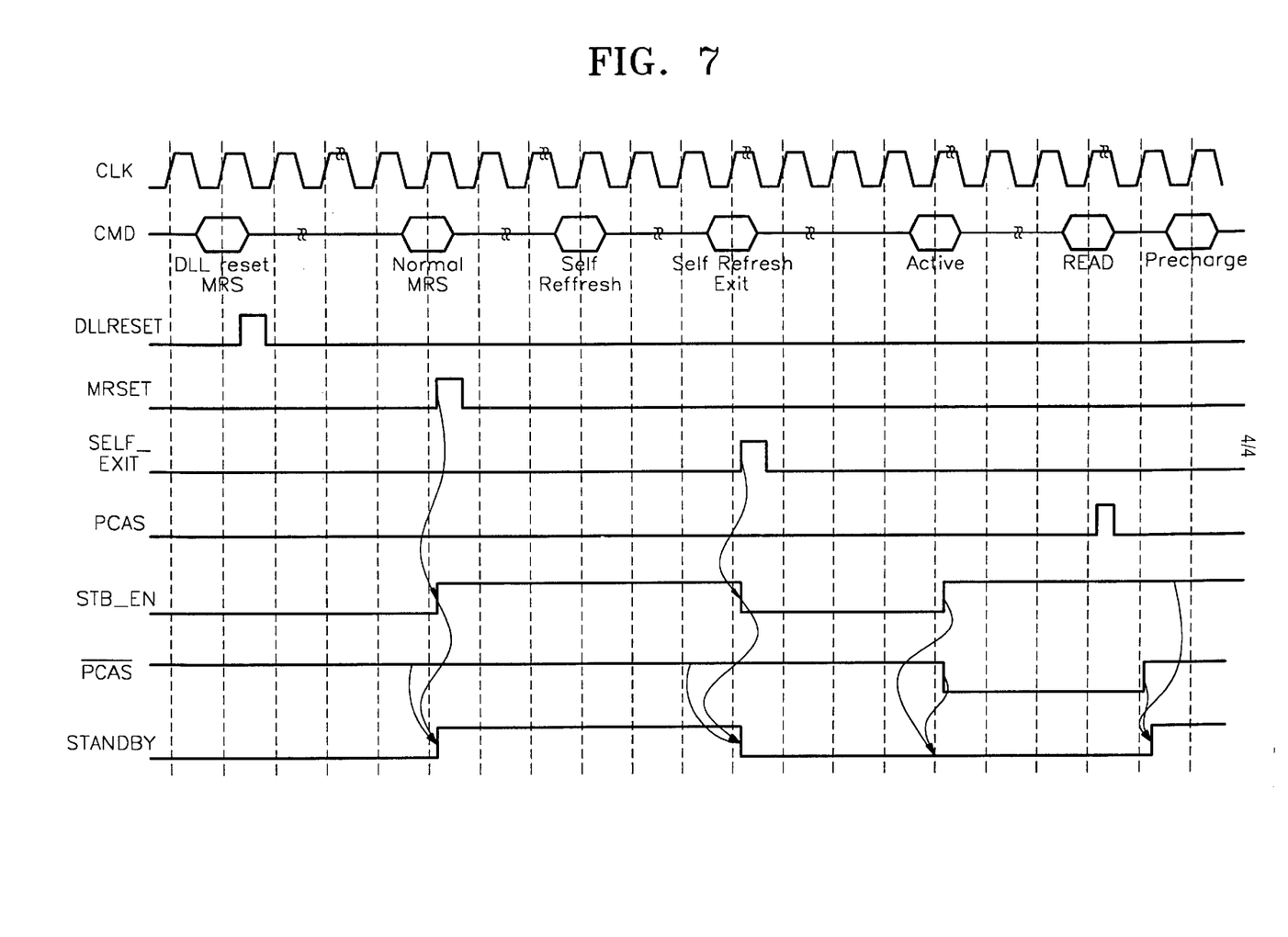
FIG. 7 is a timing diagram of a control of an operation mode of a DLL according to an embodiment of the present invention.

FIG. 7 is a timing diagram illustrating control of the operation mode of the DLL according to an embodiment of the present invention. Referring to FIGS. 1 and 7, in a case where the DLLRESET signal or the SELF_EXIT signal are in an active state for a predetermined time and the semiconductor memory device is in a precharge mode (in other words, in a case where the command signal/PCAS is activated to logic 'high'), the standby enabling signal STB_EN and consequently the standby signal STANDBY are deactivated.

In a case where the MRSET or PCAS signal is activated and the semiconductor memory device is in a precharge mode (in other words, in a case where the command signal/PCAS is activated), the standby enabling signal STB_EN and the standby signal STANDBY are activated.

The DLL locks until the DLL is reset. After a predetermined locking time lapses and even though the semiconductor memory device is in the precharge mode, the DLL cannot operate in a standby mode. The DLL cannot operate in a standby mode also during the self-refresh operation.

FIG. 3 is a block diagram illustrating a DLL including a standby operation mode according to an embodiment of the present invention. Referring to FIG. 3, the DLL includes a variable delay line (VDL) 31, a phase detector 33, and a charge pump 35. The DLL may further include a compensation delay circuit 37.

The phase detector 33 detects the difference between the phase of an external clock CLK_EXT and the phase of an internal clock CLK_NT or CLK_FB responsive to a feedback clock CLK_FB the standby signal STANDBY and/or, the internal clock CLK_INT. The phase of the feedback clock CLK_FB is converted by the external clock CLK_EXT.

The phase detector outputs signals UP and DOWN to the charge pump 35 according to the phase difference between the external clock CLK_EXT and the internal clock CLK_INT.

The charge pump 35 outputs a control voltage Vcontrol responsive to the UP or DOWN signal and an inverted standby signal/STANDBY (not shown). The control voltage Vcontrol controls the VDL 31.

The VDL 31 synchronizes the internal clock CLK_INT with the external clock CLK_EXT by controlling the delay time of the external clock CLK_EXT the standby signal STANDBY, and the control voltage Vcontrol.

The compensation delay circuit 37 outputs the feedback signal CLK_FB to the phase detector 33 in response to the internal clock CLK_INT. The compensation delay circuit 37 monitors the delay of an input buffer (not shown) and a data output buffer (not shown).

When the DLL is on, the DLL continuously performs locking and changes the control voltage Vcontrol of the charge pump 35 for controlling the delay time of the VDL 31 in order to compensate for the delay change introduced by temperature changes.

Put differently, locking information stored during the operation of the DLL is updated. However, the control voltage, which has been continuously updated, is not updated anymore and rises to a power voltage level Vcc or falls to a ground level Vss.

If the DLL is turned back on, the DLL continuously changes the control voltage Vcontrol for setting the delay time of the VDL 31 and locks. The time taken for the DLL to lock after the DLL is turned on is referred to as locking time.

Figure 4:
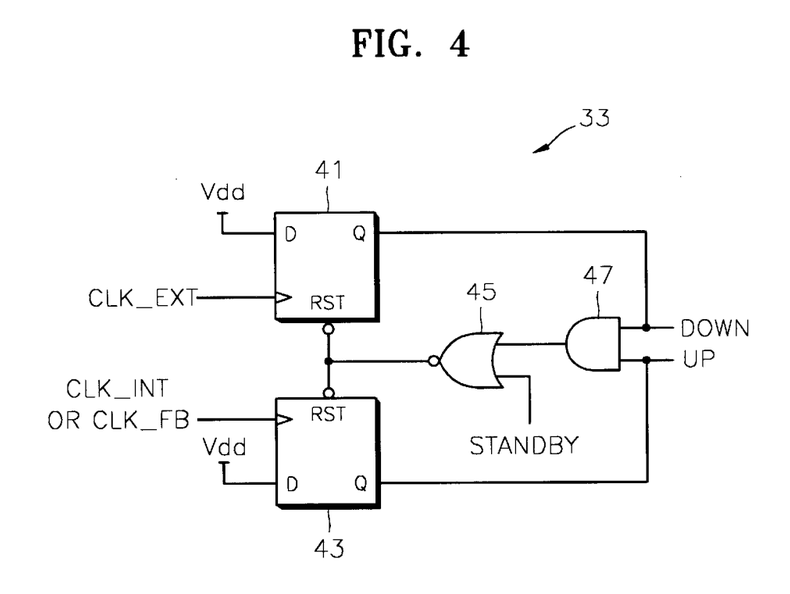
FIG. 4 is a circuit diagram of the phase detector shown in FIG. 3.

FIG. 4 is a circuit diagram illustrating the phase detector 33 shown in FIG. 3. Referring to FIG. 4, the phase detector 33 includes a first flip-flop 41, a second flip-flop 43, a NOR circuit 45, and an AND circuit 47.

The first flip-flop 41 is synchronized with the rising edge of the external clock signal CLK_EXT and outputs a signal DOWN to the charge pump 35 and a first terminal of the AND circuit 47. The second flip-flop 43 is synchronized with the rising edge of the feedback clock CLK_FB or CLK_INT and outputs a signal UP to the charge pump 35 and a second terminal of the AND circuit 47.

The AND circuit 47 outputs the results of an AND operation to the NOR circuit 45 in responsive to the signals DOWN and UP. The NOR circuit 45 resets the first and second flip-flops 41 and 43 responsive to the output signal of the AND circuit 47 and the standby signal STANDBY.

Accordingly, in a case where the standby signal STANDBY is activated (e.g., logic 'high'), the phase detector 33 is reset irrespective of the output of the AND circuit 47.

Figure 5:
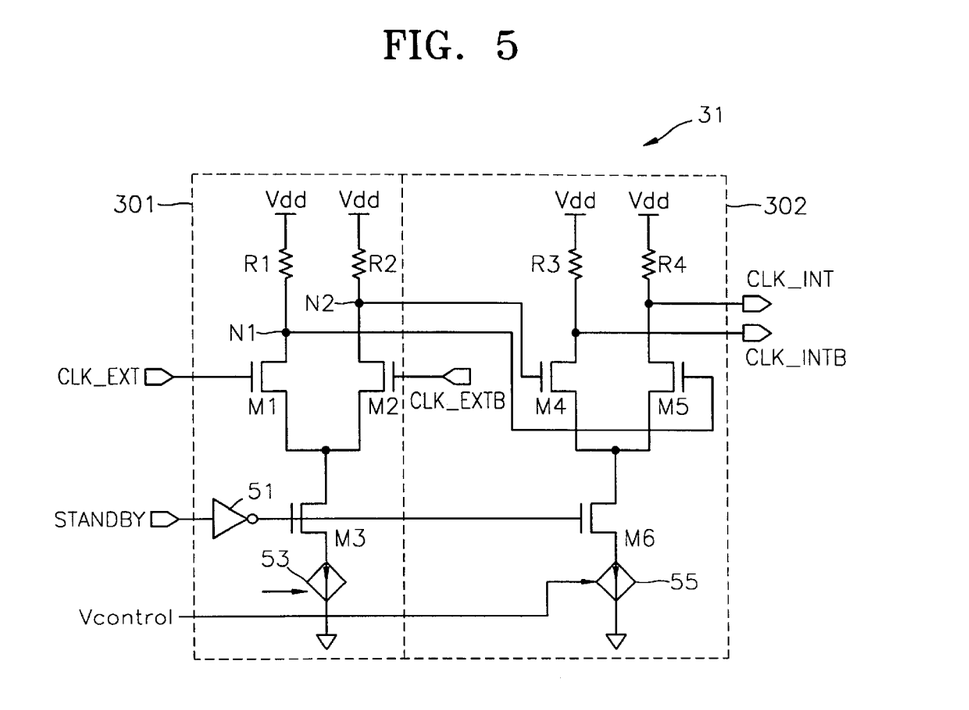
FIG. 5 is a circuit diagram of the variable delay line shown in FIG. 3.

FIG. 5 is a circuit diagram illustrating the VDL 31 shown in of FIG. 3. Referring to FIG. 5, the VDL 31 comprises a plurality of serially connected delay devices, such as differential amplifiers 301 and 302, that vary the delay time of the delay devices depending on the value of the control voltage Vcontrol. Hereinafter, the VDL 31 including two delay devices, a first differential amplifier 301 and a second differential amplifier 302, will be described.

The first differential amplifier 301 comprises resistors R1–R2, transistors M1–M2, and a current source 53. The resistor R1 which has one end connected to power supply Vdd and another end connected to the drain of a transistor M1. The transistor M1 has a gate through which the external clock signal CLK_EXT is input and a source connected to the drain of a transistor M3. The resistor R2 has one end connected to the power voltage Vdd and another end connected to the drain of a transistor M2. The transistor M2 has a gate to which an inverted signal CLK_EXTB of the external clock signal CLK_EXT is input and a source connected to the drain of the transistor M3. The current source 53 is controlled by the control voltage Vcontrol.

An inverter 51 supplies an inverted signal to the gate of the transistor M3 responsive to the standby signal STANDBY.

The second differential amplifier 302 comprises resistors R3–R4, transistors M4–M5, and a current source 55. The resistor R3 which has one end connected to the power supply Vdd and another end connected to the drain of a transistor M4 The transistor M4 which has a gate to which the voltage of a node N2 of the first differential amplifier 301 is input and a source connected to the drain of a transistor M6, a. The resistor R4 which has one end connected to the power supply Vdd and another end connected to the drain of a transistor M5, t. The transistor M5 which has a gate to which the voltage of a node N1 of the first differential amplifier 301 is input and a source connected to the drain of the transistor M6, and a c. The current source 55 which is controlled by the control voltage Vcontrol.

The inverter 51 supplies an inverted signal to the gate of the transistor M6 in response to the standby signal STANDBY.

The voltages of the drains of the transistors M4 and M5 are output as internal clock signals CLK_INT and CLK_INTB.

However, if the standby signal STANDBY is activated (e.g., in logic 'high'), the transistors M3 and M6 are turned off, and thus the VDL 31 does not operate.

Figure 6:
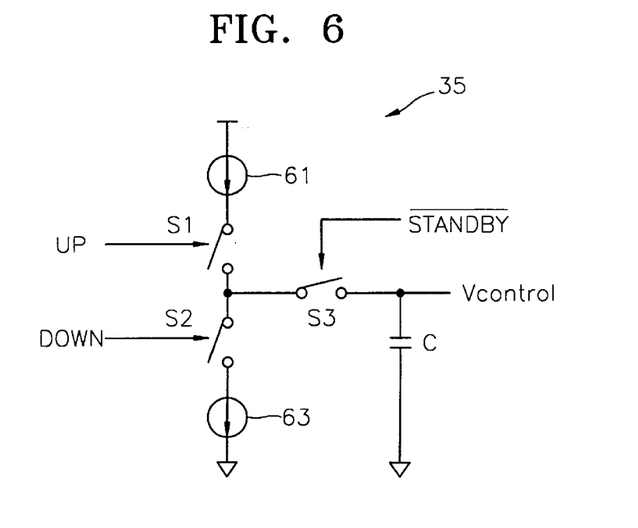
FIG. 6 is a circuit diagram of the charge pump shown in FIG. 3.

FIG. 6 is a circuit diagram illustrating the charge pump 33 shown in FIG. 3. Referring to FIG. 6, the charge pump 35 includes a first current source 61, a second current source 63, a capacitor C, and a switch S1 controlled by the UP signal of the phase detector 33, a switch S2 controlled by the DOWN signal of the phase detector 33, and a switch S3 controlled by the inverted standby signal/STANDBY.

If the standby signal STANDBY is logic 'low' and the UP and DOWN signals of the phase detector 33 are logic 'low', there is no change in the control voltage Vcontrol.

If, for example, the standby signal STANDBY is logic 'low', the UP signal is logic 'high', and the DOWN signal is logic 'low', then the control voltage Vcontrol gradually increases. If on the other hand, the standby signal STANDBY is logic 'low', the UP signal is logic 'low', and the DOWN signal is logic 'high', the control voltage Vcontrol gradually decreases.

Even in a case where the standby signal STANDBY is logic 'high' (precharge mode), the state of the control voltage Vcontrol remains unchanged irrespective of the UP or DOWN signal output from the phase detector 33.

Accordingly, if the standby signal STANDBY is activated in a case where a semiconductor memory device is in a precharge mode, the charge pump 35 continuously maintains lock, which has been maintained since the activation of the standby signal STANDBY. If the VDL 31, the phase detector 33, and the charge pump 35 are operating in responsive to an active command, the control voltage Vcontrol charging the capacitor C operates in the same locking state as the control voltage Vcontrol operated in a precharge mode.

Accordingly, a standby mode is capable of reducing current consumption of the DLL by stopping the operation of the VDL 31, the phase detector 33, and the charge pump 35 maintaining the locking information of the DLL in a precharge mode.

FIG. 7 is a timing diagram illustrating control of the operation mode of the DLL according to an embodiment of the present invention. Referring to FIG. 7, the standby signal STANDBY is inactive until the MRSET command is applied after the DLLRESET command is applied. Even in a case where the PCAS signal is applied after the SELF_EXIT command is applied, the standby signal STANDBY is still inactive. Accordingly, the standby signal STANDBY is inactive when the memory devices operate in a precharge mode.

In other words, the standby signal STANDBY is activated only in a period where the standby enabling signal STB_EN is active in a precharge mode.

Referring to FIG. 7 again. The DLL includes an ON/OFF mode, capable of turning the DLL on or off. The DLL also includes a standby mode, capable of turning the DLL off while maintaining the locking information stored before the DLL starts to operate in the precharge mode.

The standby enabling signal STB_EN is deactivated when one of the DLLRESET signal for resetting the DLL and the SELF_EXIT signal indicating that the DLL is turned on after self-refresh is completed is activated. The standby enabling signal STB_EN is activated when one of the PCAS signal generated by an active command, the MRSET signal generated by a normal mode resister set (MRS), and the DLL_LOCKED signal indicating locking time is activated.

As described above, the present invention reduces current consumption by turning the DLL off while maintaining locking information stored before the DLL operates in a precharge mode.

If one of the DLLRESET and SELF_EXIT signals is activated, the standby enable signal STB_EN is deactivated. In this case, the DLL cannot operate in a standby mode even though the semiconductor memory device is in the precharge mode. In the standby mode, locking information stored before the precharge mode of the semiconductor memory device is maintained, and predetermined circuits included in the DLL do not operate.

The drawings and specification, disclose an embodiment of the invention and, although specific terms are employed, they are used in a generic and descriptive sense only and not for purposes of limitation. The scope of the invention is set fourth in the following claims.

What is claimed is:

1. A semiconductor memory device, comprising:
   a delay locked loop (DLL) adapted to generate an internal clock synchronized with an external clock responsive to a standby signal; and
   a control signal generator adapted to output the standby signal responsive to a plurality of DLL control signals.

2. The semiconductor device of claim 1 wherein the plurality of control signals includes a DLL reset, a DLL lock, a refresh mode, an address strobe, and a mode register signal.

3. The semiconductor device of claim 1 wherein the DLL comprises:
   a phase detector adapted to generate a phase signal indicative of a phase difference between a phase of the external clock and a phase of the internal clock responsive to the standby signal;
   a charge pump adapted to generate a voltage control signal responsive to the standby signal and the phase signal; and
   a variable delay line (VDL) adapted to output the internal clock synchronized with the external clock responsive to the voltage control signal.

4. The semiconductor device of claim 3 wherein the phase detector is reset when the standby signal is active.

5. The semiconductor device of claim 3
   wherein the variable delay line comprises at least one delay device; and
   wherein a delay time of the at least one delay device operates responsive to the voltage control signal.

6. The semiconductor device of claim 3 wherein the charge pump comprises a control voltage generator adapted to generate a current responsive to the phase signal.

7. The semiconductor device of claim 1 wherein the control signal generator comprises:
   a first logic circuit adapted to output a first signal responsive to a DLL reset and refresh mode signals;
   a second logic circuit adapted to output a second signal responsive to an address strobe, an mode register, and a DLL lock signals; and
   a standby enabling circuit adapted to generate a standby enabling signal responsive to the first and second signals.

8. The semiconductor device of claim 7 wherein
   the first signal is active responsive to an active DLL reset signal; and
   the second signal is active responsive to an active DLL lock signal.

9. The semiconductor device of claim 7 wherein the standby enabling circuit comprises a cross-coupled NOR circuit.

10. A delay lock loop (DLL), comprising:
an ON/OFF mode; and
a standby mode;
wherein the ON/OFF mode turns the DLL on or off; and
wherein the standby mode turns the DLL off while maintaining lock information responsive to a standby signal;
wherein the standby signal is enabled responsive to a standby enable signal; and
wherein the standby enable signal is inactive when a DLL reset signal is active.

11. The semiconductor device of claim 10 wherein the standby enable signal is active when a DLL lock signal is active.

12. A semiconductor memory device, comprising:
a delay locked loop adapted to operate responsive to a standby signal; and
a control signal generator adapted to generate the standby signal responsive to a plurality of control signals.

13. The semiconductor memory device of claim 12 wherein the delay locked loop is adapted to generate an internal clock synchronized with an external clock.

14. The semiconductor memory device of claim 12 wherein the delay locked loop comprises:
a phase detector adapted to generate a phase signal indicative of a phase difference between a phase of the external clock and a phase of the internal clock responsive to the standby signal;
a charge pump adapted to generate a voltage control signal responsive to the standby signal and the phase signal; and
a variable delay line adapted to output the internal clock synchronized with the external clock responsive to the voltage control signal.

15. The semiconductor memory device of claim 14 wherein the phase detector is reset when the standby signal is active.

16. The semiconductor memory device of claim 14 wherein the variable delay line comprises at least one delay device; and
wherein a delay time of the at least one delay device operates responsive to the voltage control signal.

17. The semiconductor memory device of claim 14 wherein the charge pump comprises a control voltage generator adapted to generate a current responsive to the phase signal.

18. The semiconductor memory device of claim 12 wherein the control signal generator comprises:
a first logic circuit adapted to output a first signal responsive to a DLL reset and refresh mode signals;
a second logic circuit adapted to output a second signal responsive to an address strobe, an mode register, and a DLL lock signals; and
a standby enabling circuit adapted to generate a standby enabling signal responsive to the first and second signals.

19. The semiconductor device of claim 18 wherein
the first signal is active responsive to an active DLL reset signal; and
the second signal is active responsive to an active DLL lock signal.

20. The semiconductor device of claim 18 wherein the standby enabling circuit comprises a cross-coupled NOR circuit.

* * * * *

UNITED STATES PATENT AND TRADEMARK OFFICE
CERTIFICATE OF CORRECTION

PATENT NO. : 6,678,206 B2
DATED : January 13, 2004
INVENTOR(S) : Chu et al.

It is certified that error appears in the above-identified patent and that said Letters Patent is hereby corrected as shown below:

Column 6,
Line 49, "M4 The" should read -- M4. The --.
Line 51, "M6, a. The" should read -- M6. The --.
Line 54, "M5, t. The" should read -- M5. The --.
Line 56, "M6, and a c. The" should read -- M6. The --.

Signed and Sealed this

Sixth Day of July, 2004

JON W. DUDAS
*Acting Director of the United States Patent and Trademark Office*